(12) United States Patent
Corhodzic et al.

(10) Patent No.: US 12,074,437 B2
(45) Date of Patent: Aug. 27, 2024

(54) SUPERCONDUCTOR NETWORK FOR DYNAMICALLY RECONFIGURABLE POWER PLANE

(71) Applicant: Google LLC, Mountain View, CA (US)

(72) Inventors: Selver Corhodzic, Campbell, CA (US); Drazena Brocilo, Los Gatos, CA (US)

(73) Assignee: Google LLC, Mountain View, CA (US)

(*) Notice: Subject to any disclaimer, the term of this patent is extended or adjusted under 35 U.S.C. 154(b) by 1083 days.

(21) Appl. No.: 16/923,482

(22) Filed: Jul. 8, 2020

(65) Prior Publication Data
US 2022/0014020 A1 Jan. 13, 2022

(51) Int. Cl.
| | |
|---|---|
| G06F 1/26 | (2006.01) |
| G06F 1/18 | (2006.01) |
| H02J 3/00 | (2006.01) |
| H02J 3/38 | (2006.01) |
| H05K 7/14 | (2006.01) |

(52) U.S. Cl.
CPC ............ H02J 3/00 (2013.01); G06F 1/189 (2013.01); G06F 1/263 (2013.01); H02J 3/38 (2013.01); H05K 7/14 (2013.01)

(58) Field of Classification Search
CPC ............ G06F 1/189; G06F 1/263; H05K 7/14
USPC .......................................................... 327/64
See application file for complete search history.

(56) References Cited

U.S. PATENT DOCUMENTS

| | | | | |
|---|---|---|---|---|
| 8,423,103 | B2 * | 4/2013 | Hennessy | H05K 7/20709 |
| | | | | 505/163 |
| 9,857,855 | B2 * | 1/2018 | Kaplan | H02J 9/06 |
| 9,997,955 | B1 * | 6/2018 | Ross | H02J 1/108 |
| 10,175,737 | B1 * | 1/2019 | Kong | G06F 1/30 |
| 11,031,706 | B1 * | 6/2021 | Corhodzic | H01B 12/02 |
| 11,048,311 | B1 * | 6/2021 | Churnock | G06F 1/28 |
| 11,495,896 | B2 * | 11/2022 | Corhodzic | H02J 3/007 |
| 2006/0097578 | A1 * | 5/2006 | Baldwin | H02J 1/001 |
| | | | | 307/103 |
| 2011/0148213 | A1 * | 6/2011 | Baldwin | H02J 1/001 |
| | | | | 307/82 |

(Continued)

OTHER PUBLICATIONS

AMSC: "Superconductor LVDC Data Center Power Cables", Dec. 31, 2012 (Dec. 31, 2012), XP055801519, Retrieved from the internet: URL:https:..www.amsc.com/wp-content/uploads/LVDC_BRO_0412_web.pdf.*

(Continued)

*Primary Examiner* — Ryan Jager
(74) *Attorney, Agent, or Firm* — Lerner David LLP

(57) ABSTRACT

A system including a network of superconducting electrical cables configured to supply power to a plurality of server racks arranged within a space of a building, a first power source connection configured to connect a first power source to the network of superconducting electrical cables from a first side of the building and configured to supply power to a first section of the network of superconducting electrical cables, a second power source connection configured to connect a second power source to the network of superconducting electrical cables from a second side of the building different from the first side and configured to supply power to a second section of the network of superconducting electrical cables, and a plurality of bus ducts, each bus duct configured to connect the network of superconducting electrical cables to one or more of the plurality of server racks.

20 Claims, 10 Drawing Sheets

(56) References Cited

U.S. PATENT DOCUMENTS

| | | | | |
|---|---|---|---|---|
| 2015/0331467 A1* | 11/2015 | Kaplan | ............... | H02J 9/066 |
| | | | | 713/300 |
| 2015/0378408 A1* | 12/2015 | Kaplan | ............... | H05K 7/1492 |
| | | | | 713/300 |
| 2016/0195911 A1* | 7/2016 | Chapel | ............... | G06F 1/28 |
| | | | | 713/340 |
| 2022/0014020 A1* | 1/2022 | Corhodzic | ............... | H02J 3/00 |

OTHER PUBLICATIONS

Superconductor LVDC Data Center Power Cables. AMSC. Dec. 31, 2012. Retrieved from the Internet: <https://www.amsc.com/wp-content/uploads/LVDC_BRO_0412_web.pdf>. Retrieved on May 4, 2021, 3 pages.

Partial European Search Reort for European Patent Application No. 20211006.0 dated May 17, 2021. 11 pages.

Extended European Search Report for European Patent Application No. 20211006.0 dated Aug. 17, 2021. 10 pages.

First Office Action for Chinese Patent Application No. 202011090546.2 dated Jan. 3, 2024. 7 pages.

Office Action for Chinese Patent Application No. 202011090546.2 dated Jun. 11, 2024. 6 pages.

* cited by examiner

SUPERCONDUCTOR NETWORK FOR DYNAMICALLY RECONFIGURABLE POWER PLANE

BACKGROUND

Large scale datacenters include numerous server racks that require electrical power to operate. Datacenter buildings may have several floors, each floor having server racks thereon. For each floor, the server racks may be kept at floor level, while power is routed to the server racks via busways positioned overhead the server racks, underneath the server racks, or at floor level alongside the server racks. The electrical power provided to a single floor of the datacenter may be on the order of tens of megawatts, and the electrical power provided to the datacenter buildings may be on the order of hundreds of megawatts.

The electrical power is provided from one or more power sources. Typically, the electrical power is routed into the building from one side, and divided between aisles of server racks via a branch network of busways. In an example system, electrical power may be fed to one or more floors of a datacenter from one or more power sources by branching electrical connections, and the electrical connections connect to parallel busways. The busways deliver power from a first side of the building to a second side of the building. Each busway may connect to server racks along parallel aisles within the building.

Power distribution is subject to several drawbacks. Because power is provided from only the first side of the building, a current density of the provided power is much higher at the first side than at the second side. However, the busways are typically designed uniformly, which leads to underutilization of the conducting material of the busways closer to the second side of the building. Complex and expensive infrastructure, including transfer switches and breakers, is also needed to branch the power sources to the busways and to the server racks of the multiple aisles of the datacenter.

Another problem with unidirectional power distribution is that malfunctioning upstream equipment can result in downtime for downstream equipment. Redundant busways and additional infrastructure are needed in order to provide a backup power distribution solution for when upstream equipment malfunctions, as well as to accommodate maintenance for one section of the system without taking the rest of the system offline.

Additionally, because each aisle of the datacenter is designed to receive a same amount of electrical power, it is necessary to balance the server racks of the datacenter between the busways and aisles such that a power density of one busway or aisle is not imbalanced with the power density of another busway or aisle. In order to avoid imbalance, servers requiring a relatively high current density, such as machine learning data catalog (MLDC) servers, must be distributed throughout the datacenter, and careful advance planning is needed to avoid these high power density servers from being concentrated in a single portion of the building.

BRIEF SUMMARY

The present disclosure provides a network of superconducting cables included in a dynamically configurable power plane for powering a large scale system such as a datacenter. The power plane may be arranged to receive electrical power from multiple sides of the building, and the superconducting cables may control the direction and distribution of the received electrical power throughout the building.

One aspect of the present disclosure is directed to a system including a network of superconducting electrical cables configured to supply power to a plurality of server racks arranged within a space of a building, a first power source connection configured to connect a first power source to the network of superconducting electrical cables from a first side of the building and configured to supply power to a first section of the network of superconducting electrical cables, a second power source connection configured to connect a second power source to the network of superconducting electrical cables from a second side of the building different from the first side and configured to supply power to a second section of the network of superconducting electrical cables, and a plurality of bus ducts, each bus duct configured to connect the network of superconducting electrical cables to one or more of the plurality of server racks.

In some examples, the first side and the second side may be opposite sides of the building.

In some examples, the system may further include a plurality of switch controllers. Each switch controller may be configured to control an electrical connection between at least one of the first and second power source connection and at least one server rack.

In some examples, the plurality of switch controllers may include a superconducting switch positioned between a first section and a second section of the network of superconducting electrical cables and may be configured to control an electrical connection between the first section and the second section of the network of superconducting electrical cables.

In some examples, the plurality of switch controllers may include an electrical switch positioned at a first bus duct and may be configured to control an electrical connection between the first bus duct and one or more server racks connected to the first bus duct.

In some examples, the plurality of switch controllers may include an electrical switch positioned at a first server rack and may be configured to control an electrical connection between a plurality of bus ducts connected to the first server rack and the first server rack In some examples, the plurality of server racks may be divided into discrete portions, wherein each discrete portion is connected to each of the first and second power sources. The plurality of switch controllers may be configurable to disconnect any one of the discrete portions of the plurality of server racks from the first and second power sources while the other portions of the plurality of server racks remain connected to at least one of the first or second power source.

In some examples, the network of superconducting electrical cables may be arranged to permit power flow therethrough in a snake configuration.

In some examples, the network of superconducting electrical cables may be arranged to permit power flow therethrough in a ring configuration.

In some examples, the network of superconducting electrical cables may be arranged to permit power flow therethrough in a mesh configuration.

In some examples, the network of superconducting electrical cables may be positioned vertically above the plurality of server racks.

In some examples, the space of the building may include a first section containing a first portion of servers assigned a relatively high priority, and a second section containing a second portion of servers assigned a relatively low priority.

In some examples, the first portion of servers may include at least one of machine learning servers or networking gear.

In some examples, the superconducting electrical cables may be configured to transmit a direct current (DC) voltage between about 1 kV and 40 kV.

In some examples, the superconducting electrical cables may be configured to transmit a DC current between about 10 kA and 30 kA.

Another aspect of the disclosure is directed to a datacenter including a system according to any one of the embodiments described herein, and a plurality of server racks arranged within a space of a building.

Yet another aspect of the disclosure is directed to a server maintenance method for updating portions of servers within a datacenter that includes a network of superconducting electrical cables configured to supply power from each of a first power source and a second power source to a plurality of server racks arranged within a space of a building. The network of superconducting electrical cables may be connected to the first power source via a first power source connection positioned at a first side of the building and to the second power source via a second power source connection positioned at a second side of the building different from the first side. One or more controllers may be configured to control electrical connections between the first and second power sources and the plurality of server racks. The method may include providing, from the one or more controllers, first control signals to electrically disconnect a first portion of servers from the first and second power sources without disconnecting a second portion of servers from the first and second power sources, conducting maintenance on the first portion of servers, providing, from the one or more controllers, second control signals to electrically reconnect the first portion of servers to the first and second power sources without disconnecting the second portion of servers from the first and second power sources, providing, from the one or more controllers, third control signals to electrically disconnect the second portion of servers from the first and second power sources without disconnecting the first portion of servers from the first and second power sources, conducting maintenance on the second portion of servers, and providing, from the one or more controllers, fourth control signals to electrically reconnect the second portion of servers to the first and second power sources without disconnecting the first portion of servers from the first and second power sources. The first and second portions of servers may be portioned or sectioned according to respective levels of confidentiality.

In some examples, the first control signals may electrically disconnect a first section of the network of superconducting electrical cables from a second section of the network of superconducting electrical cables, and the second control signals may electrically reconnect the first section of the network of superconducting electrical cables to the second section of the network of superconducting electrical cables.

In some examples, the first control signals may electrically disconnect the first portion of servers from the network of superconducting electrical cables at one or more direct current bus ducts configured to provide power from the network of superconducting electrical cables to the first portion of servers, and the second control signals may electrically reconnect the first portion of servers to the network of superconducting electrical cables at the one or more direct current bus ducts.

In some examples, the first control signals may electrically disconnect a first server rack of the first portion of servers from each of a first direct current bus duct configured to provide power from the first power source to the first server rack and a second direct current bus duct configured to provide power from the second power source to the first server rack, and the second control signals may electrically reconnect a first server rack to the first and second direct current bus ducts.

DETAILED DESCRIPTION

Overview

The technology relates generally to a superconductor cable network for distribution of electrical power in large scale systems such as datacenters, and more particularly to a switching network for a dynamically configurable power plane for powering a large scale system such as a datacenter.

Electrical power may be distributed to the large scale system over a power bus. The power bus may include busways for carrying the electrical power. The power bus may include several connecting elements, including busway connections for connecting the power bus to rows of server racks in the datacenter, and power source connections for connecting the power bus to one or more power sources at multiple points. The switching network may include a plurality of switches included in the power bus and configured to direct power between the power sources and busway connections in order to provide power to all server racks.

The switches may be controlled using control signals in order to distribute power throughout the datacenter in a desired fashion. For example, power may be diverted away from a section of the datacenter while the rest of the datacenter continues to receive power and remains operational. This may be done in order to perform maintenance on the disconnected section of the datacenter while the rest of datacenter remains operational.

The system may be arranged to control the concentration of power within the power bus. For example, power source connections may be located at different quadrants or sides of the datacenter. Additionally, bidirectional and multi-directional switches may be provided within the power bus to facilitate the redirection of power throughout the system.

Such configurations avoid unidirectional flow of current from a high current density side of the datacenter to a low current density side. As such, it may be possible to achieve a more uniform current density throughout the datacenter, while at the same time enabling high power density to be directed to particular locations of the datacenter as needed.

The arrangements described herein provide numerous advantages over a conventional datacenter power bus providing unidirectional current flow from "upstream" bus elements to "downstream" elements. For example, a conventional datacenter power bus may require balancing between server racks at different current densities, carries the risk of upstream failures resulting in downstream outages, and general underutilization of the downstream bus elements since current density decreases as the distance from the power sources increases. By contrast, the power bus and switching network arrangement of the present disclosure allows for bidirectional and multidirectional current flow, meaning that bus elements are not "upstream" or "downstream" from one another, current density may be balanced throughout the datacenter, and bus elements do not go underutilized.

Example Systems

Figure 1:
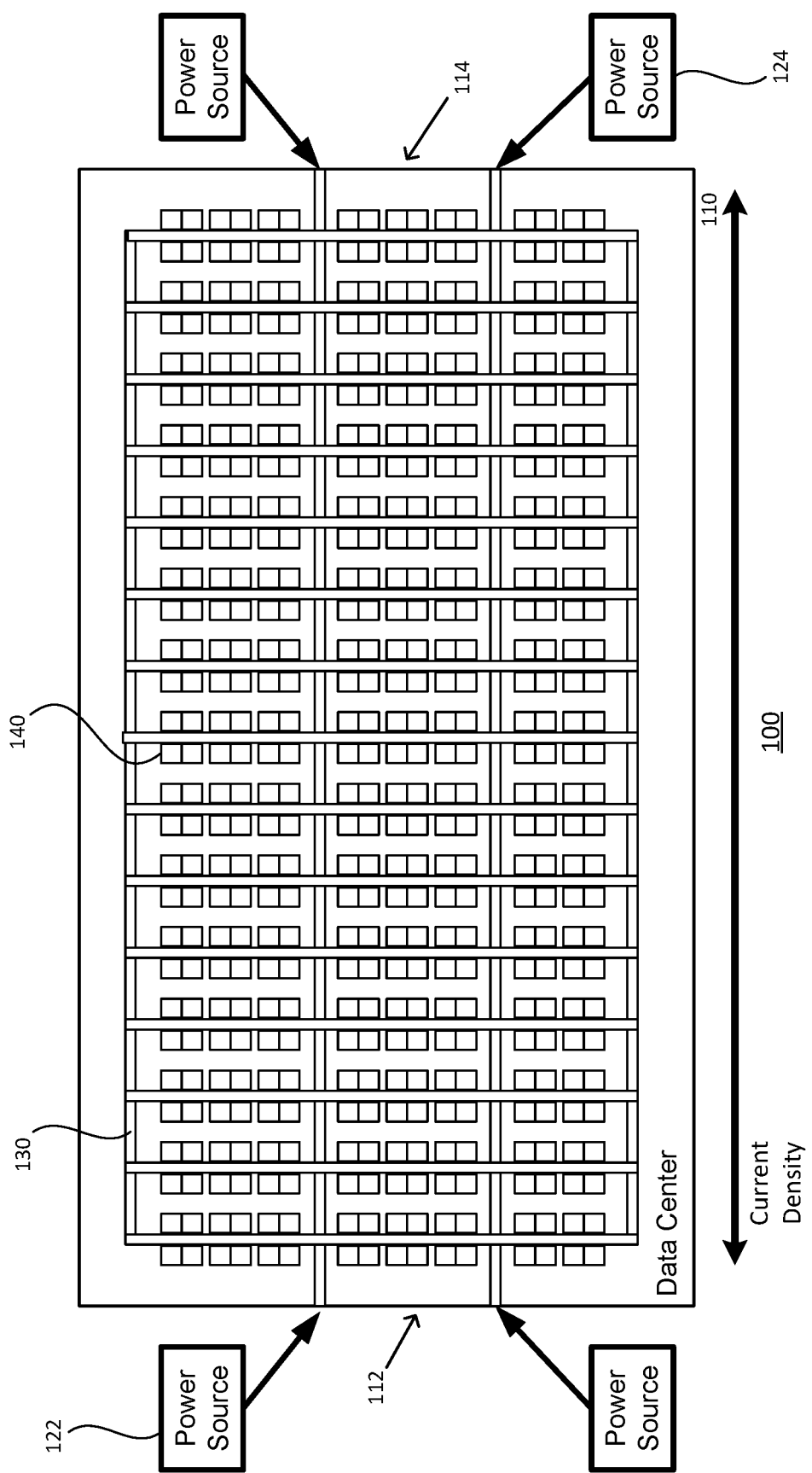
FIG. 1 is a schematic diagram of electrical connections of an example datacenter system according to aspects of the disclosure.

FIG. 1 illustrates an example system 100 for distribution of electrical power in a large scale datacenter 110. The datacenter 110 may receive electrical power from more than one side of the building. For instance, a first side 112 of the building may include electrical connections between at least a first power source 122 and a power bus 130, and a second side 114 of the building may include electrical connections between at least a second power source 124 and the power bus 130.

The power bus 130 may be a busway made up of superconducting electrical cables. The superconducting electrical cables may be configured to carry direct current (DC) electricity between about 10 kA-30 kA. Due to low resistance of the superconducting cables, the voltage at a given point of the superconducting cables may be between about 1 kV-40 kV.

Each superconducting cable may connect to one or more server racks 140. The power bus 130 may be a power plane positioned vertically overhead the server racks 140 in order to leave space at the datacenter floor. Alternatively, given the relatively small size of the superconducting cables compared to conducting busway elements of a standard power bus, the power plane may be routed vertically underneath the server racks 140, which may also leave space at the datacenter floor. As a further alternative, the superconducting cables may be run alongside the server racks 140 at floor level without taking up an undue amount of space.

The power bus 130 may be configured to divert and directed electrical power throughout the building over the network of bus sections. Because of the low resistance in the superconducting cables, power provided from the first side 112 of the building can be passed through the superconducting cables to the second side of the building with minimal losses due to resistance. This means that high current density can easily be concentrated at any given location of the datacenter building, and so demands for high current density can be met at any location. The ability to meet high current density demands includes even when two or more server racks in a discrete section of the datacenter require high current density at the same time.

In the example of FIG. 1, the first side 112 and second side 114 of the building are opposite sides of the building. However, in other examples, the first and second sides may be adjacent or non-opposite sides of the building, provided that the electrical power does not run in a single downstream direction through the building. Additionally, more than two power sources may be provided to the building. In the example of FIG. 1, four power sources are shown, although in other examples more or fewer power sources may be connected. It should also be understood that in other examples, power sources may be connected to busway elements from any side of the building. Furthermore, although FIG. 1 shows a schematic layout of only one floor of a datacenter, it should be understood that the datacenter may include multiple floors, each floor including additional servers and server racks, which may have the same or a similar layout as the floor shown in FIG. 1.

Figure 2:
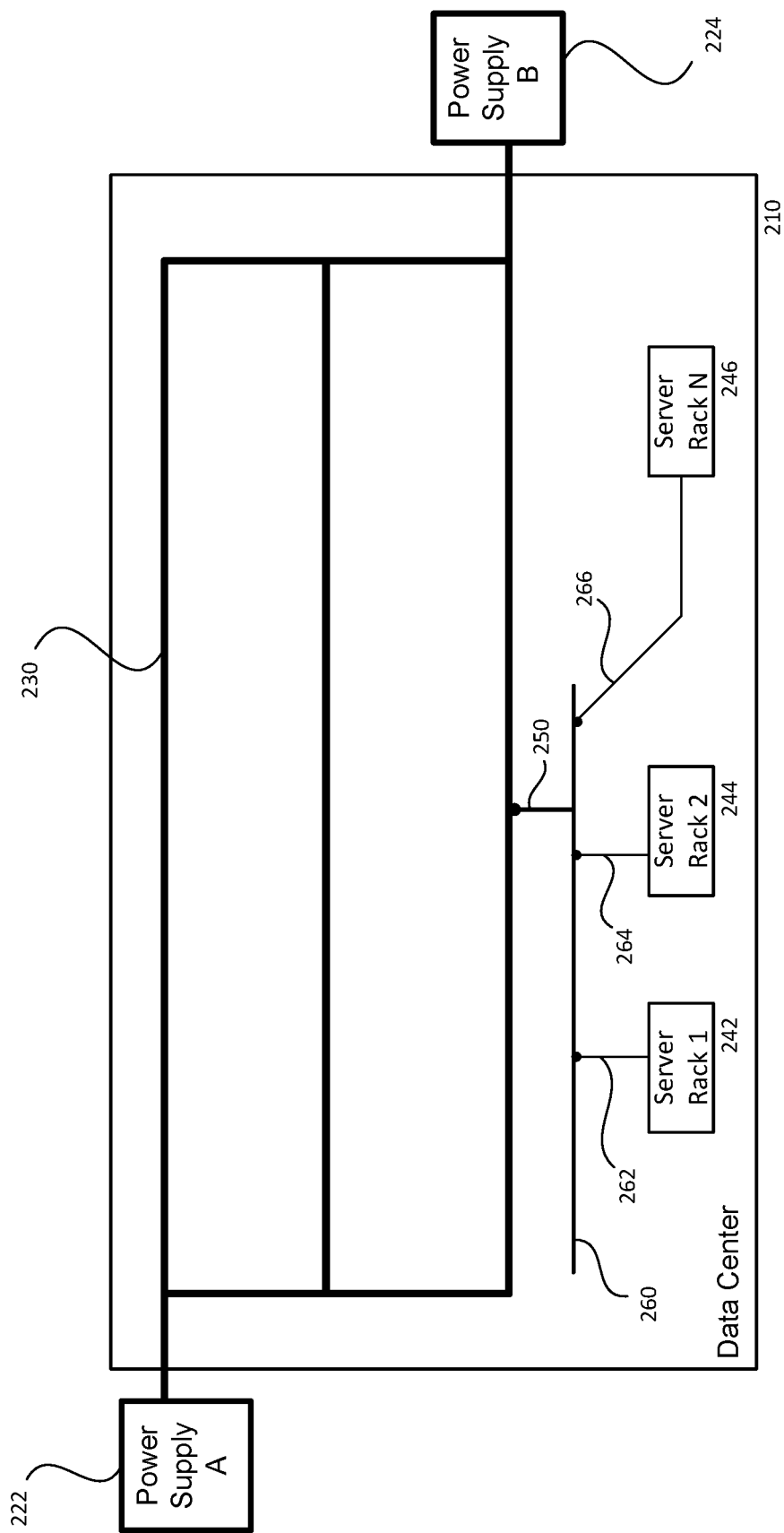
FIG. 2 is a schematic diagram of an example electrical connection between a power plane and server infrastructure according to aspects of the disclosure.

FIG. 2 illustrates an example electrical connection between a superconducting cable power plane and server racks of a datacenter. In the system 200 of FIG. 2, a datacenter building 210 is connected to each of Power Supply A 222 and Power Supply B 224 from opposite sides of the building 210. Both power supplies connect to a network of superconducting cables 230 inside the building by way of power supply connections at opposite ends of the building 210. In the example of FIG. 2, both power supplies 222, 224 are connected to the same superconducting cables, such that power from both power supplies 222, 224 may be directed to any point within the network of superconducting cables 230. Server racks 242, 244, 246 may be electrically connected to both power supplies 222, 224 by way of a connection to the superconducting cables.

In the example of FIG. 2, the power plane 230 is shown to include an interface 250 for providing DC power to a DC bus duct 260. The DC bus duct 260 may carry power from the power plane to each of the connected server racks 1-N, 242, 244, 246. The power plane may be arranged in any of various configurations, including but not limited to a mesh configuration, a ring configuration, and a snake configuration. Additionally, in some example arrangements herein, one or more controllers may be provided within the power plane to direct or distribute power through the power plane, which in turn may control the configuration of the power plane. Thus, the power plane may be from a mesh configuration to a ring configuration or vice versa, or between any of the other example configurations, by the controllers in the power plane.

The interface 250 may be designed to interface a superconducting cable of the power plane 230 to copper plates of a copper conductor included in the DC bus duct 260. Superconducting cables are generally designed to operate at very low temperatures in order to maintain the low resistance properties. By contrast, copper conductors are designed conduct electricity at or around room temperature. Therefore, the interface 250 is designed specifically to provide an electrical connection between the very low temperature superconducting cable and the relatively warmer bus duct, while maintaining the temperature difference and avoiding a reduction in efficiency or increase in resistance at the superconducting cable. Additionally, the superconducting cable may have a high voltage of several kilovolts and high current of several kiloamperes, whereas the DC bus ducts may be configured to carry a medium voltage on the order of hundreds of volts, such as between 110 to 440 volts, and relatively low current such as a commodity level current, such as about 20 A. Thus, the interface 250 is also designed specifically to provide an electrical connection between a high voltage line such as the superconducting cable and a medium voltage line such as the copper DC bus duct. Such interfaces have been developed in other applications with efficiency and without degradation of the superconducting cable, such as in power transmission for the Large Hadron Collider at CERN, and could be applied in a similar manner to distribute power to server racks of a datacenter. The DC bus duct 260 may further connect to the plurality of server racks 1-N, 242, 244, 246, by way of one or more respective tap connectors 262, 264, 266.

Although only one DC bus duct 260 is shown in FIG. 2 for purposes of illustration, it should be understood that the datacenter includes several DC bus ducts, each bus duct being connected to the power plane at various interface pints distributed throughout the power plane. Each DC bus duct may have a relatively short length compared to the power plane, and may connect to a limited number of server racks. For example, the DC bus ducts may have a length of between about 10 and 100 meters, and may connect to hundreds of server racks. The use of short DC bus ducts provide a high degree of flexibility for configuring the datacenter, such that wide ranges of power density may be provided between different DC bus duct and between different sections of the building.

Electrical connections between the power plane 230, the DC bus duct 260, and the server racks 242, 244, 246, may be controlled by one or more controllers (not shown). In some examples, the controllers may be manually operated physical switches accessible from within the datacenter building. The physical switches may be distributed throughout the building, concentrated in a specific location, or some combination of the two. In other examples, the controllers may include one or more computing systems having one or more processors, memory for storing instructions operations to be executed by the one or more processors, and input/output components. The processor can be a well-known processor or other lesser-known types of processors, and may be a dedicated controller such as an ASIC. The memory may be a type of non-transitory computer readable medium capable of storing information accessible by the processor such as a hard-drive, solid state drive, tape drive, optical storage, memory card, ROM, RAM, DVD, CD-ROM, write-capable, and read-only memories. The input/output components may be capable of transmitting and receiving data, such as receiving input signals such as user inputs or monitored data about the datacenter, and transmitting control signals to control one or both of the interface 250 and the tap connectors 262, 264, 266.

Figure 3:
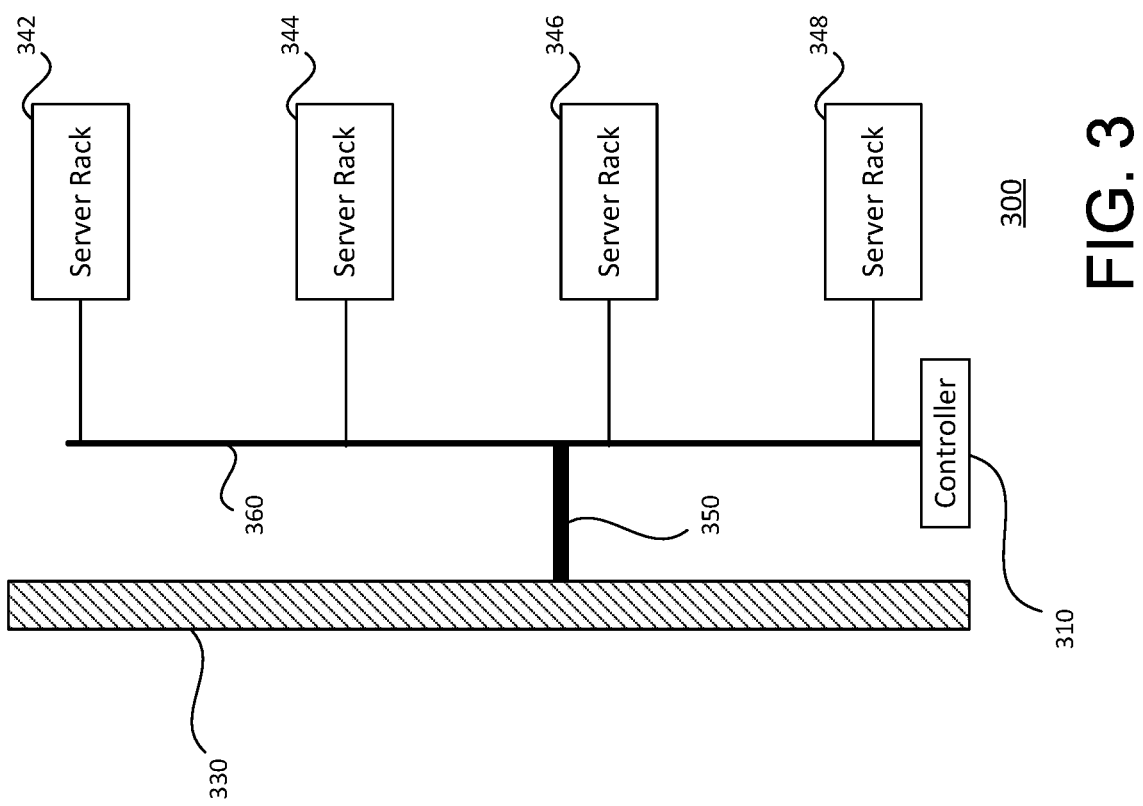
FIGS. 3 and 4 are example implementations of the example electrical connection of FIG. 2 according to aspects of the disclosure.

FIG. 3 illustrates an example implementation of a power distribution system 300 using superconductor cables, such as in the system 200 of FIG. 2. In the example of FIG. 3, each server rack 342, 344, 346, 348 is connected to a power plane 330 through an interface 350, DC bus duct 360, and tap connection as described in connection with FIG. 2. A controller 310 is positioned along the DC bus duct 360 in order to control opening and closing the connections between the DC bus duct 360 and the server racks. Thus, the controller is configured to provide control signals to the interface 350 and individual tap connectors over the DC bus duct 360, thereby controlling the distribution of power from the power plane 330 to the individual server racks 342, 344, 346, 348. In the example of FIG. 3, each DC bus duct of the datacenter may be provided with a separate controller in order to control the distribution of power from the power to the server racks connected to that DC bus duct.

Figure 4:
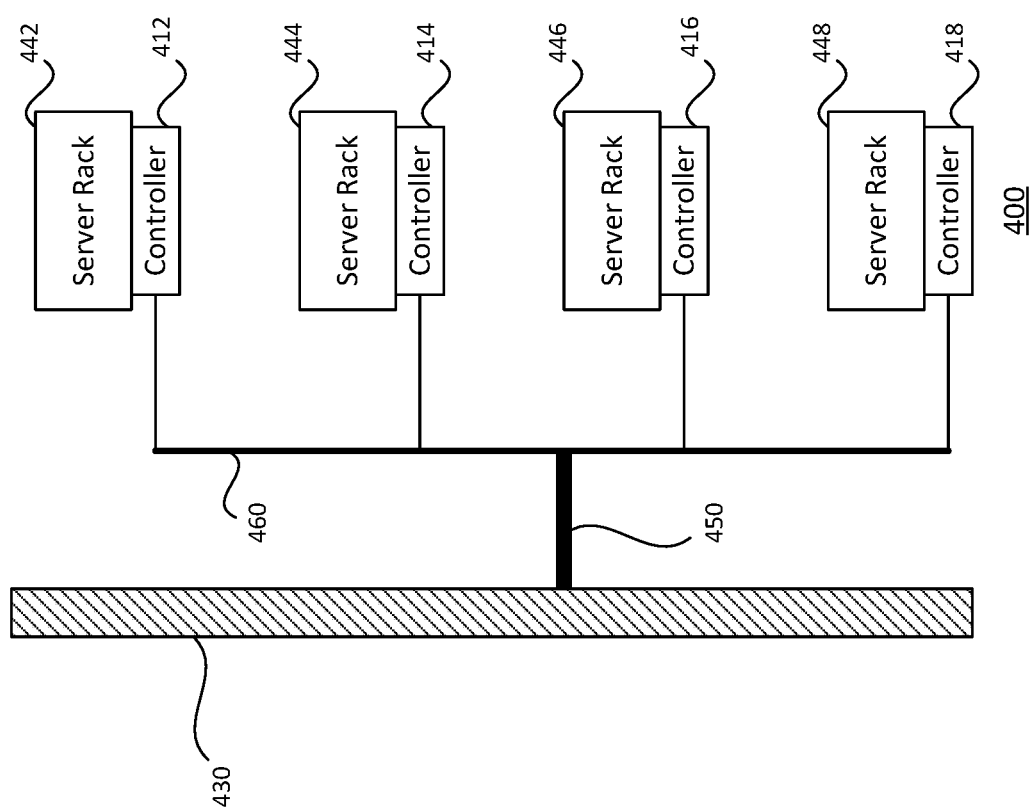

FIG. 4 illustrates an alternate example implementation of a power distribution system 400 using superconductor cables, such as in the system 200 of FIG. 2. In the example of FIG. 4, each server rack 442, 444, 446, 448 is connected to a power plane 430 through an interface 450, DC bus duct 460, and tap connection as described in connection with FIG. 2. Respective controllers 412, 414, 416, 418 are positioned at corresponding server racks 442, 444, 446, 448. Each controller is configured to control opening and closing a connection between the DC bus duct 460 and the controller's corresponding server rack. Thus, each controller is configured to manage power distribution from the individual tap connections the DC bus duct 460 to the respective server racks, in turn controlling the distribution of power from the power plane 430 to the individual server racks 442, 444, 446, 448. In the example of FIG. 4, each server rack may be provided with a separate controller. Alternatively, clusters of server racks may be provided with a single controller, thereby controlling power distribution on a cluster-by-cluster basis.

In the examples of FIGS. 2-4, each server rack is connected to both power sources through a single superconducting cable connection. However, in other examples, the server racks may be connected to different power sources through respective superconducting cable connections.

Figure 5:
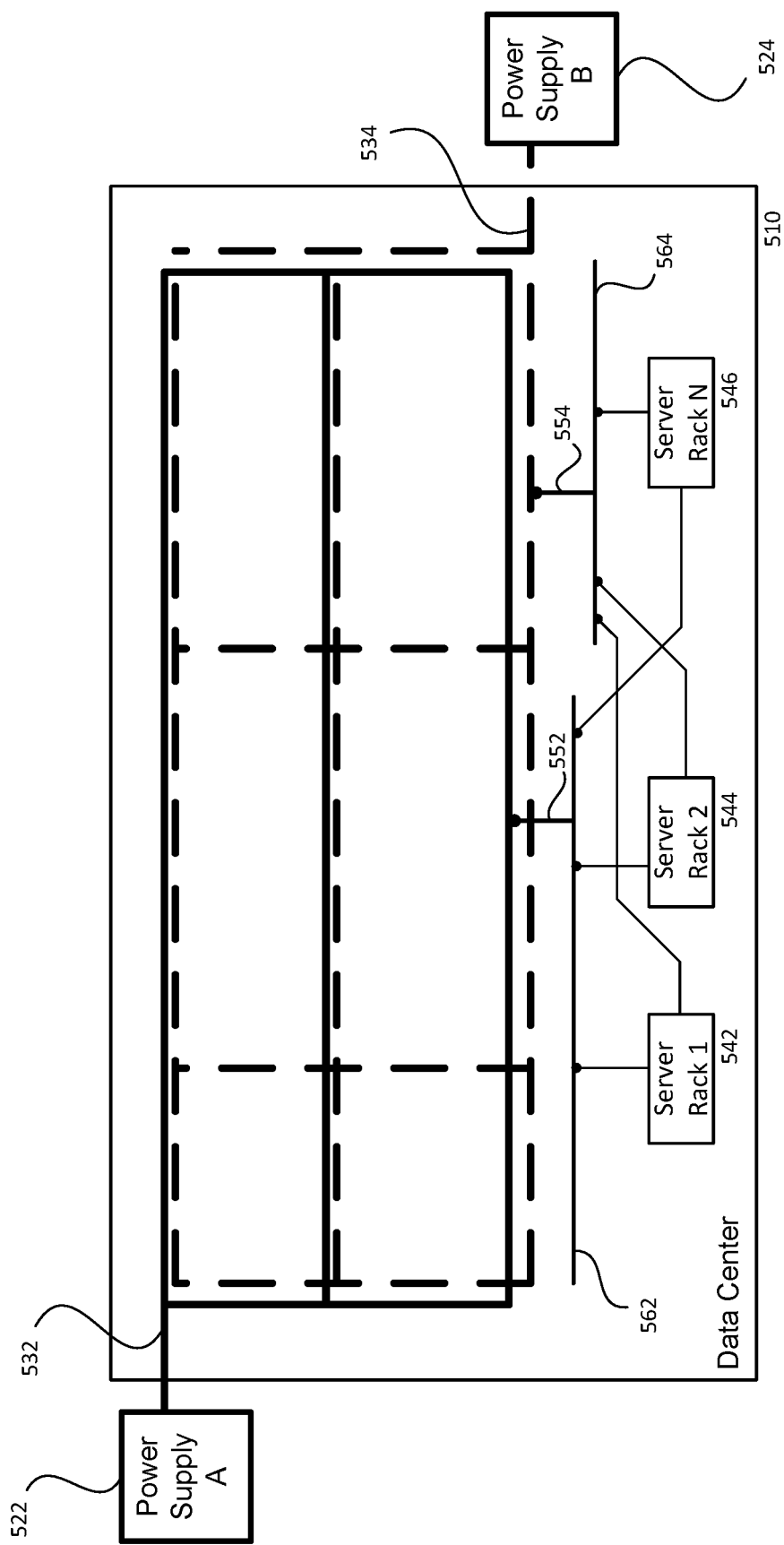
FIG. 5 is a schematic diagram of another example electrical connection between power planes and server infrastructure according to aspects of the disclosure.

FIG. 5 illustrates another example electrical connection between a superconducting cable power plane and server racks of a datacenter. In the system 500 of FIG. 5, a datacenter building 510 is connected to each of Power Supply A 522 and Power Supply B 524 from opposite sides of the building 510. Power Supply A 522 is connected to a first power plane network of superconducting cables 532 inside the building by way of a first power supply connection at the first side of the building 510. Power Supply B 524 is connected to a second power plane network of superconducting cables 534 inside the building by way of a second power supply connection at the opposing second side of the building 510.

In the example of FIG. 5, the networks of superconducting cables 532, 534 are not connected to each other, such that the power supplies 522, 524 are connected to different superconducting cables. However, both networks run may be arranged to run parallel to each other in order to provide electrical power from either power source to any point within the building 510. In other example arrangements, the building may include connections for connecting the two networks to one another in order to form a single network. This could result in a network of superconducting cables having at least some redundant cables.

Server racks 542, 544, 546 may be electrically connected to both power supplies 522, 524 by way of a connection to respective superconducting cables from the parallel power plane networks 532, 534. In the example of FIG. 5, the first power plane 532 is shown to include an interface 552 for providing DC power to a first DC bus duct 562. The first DC bus duct 562 may carry power from the first power plane 532 to each of the connected server racks 1-N, 542, 544, 546. In parallel, the second power plane 534 is shown to include an interface 554 for providing DC power to a second DC bus duct 564. The second DC bus duct 564 may carry power from the second power plane 534 to each of the connected server racks 1-N, 542, 544, 546. Thus, each server rack may include multiple connections in order to connect to multiple power sources.

Figure 6:
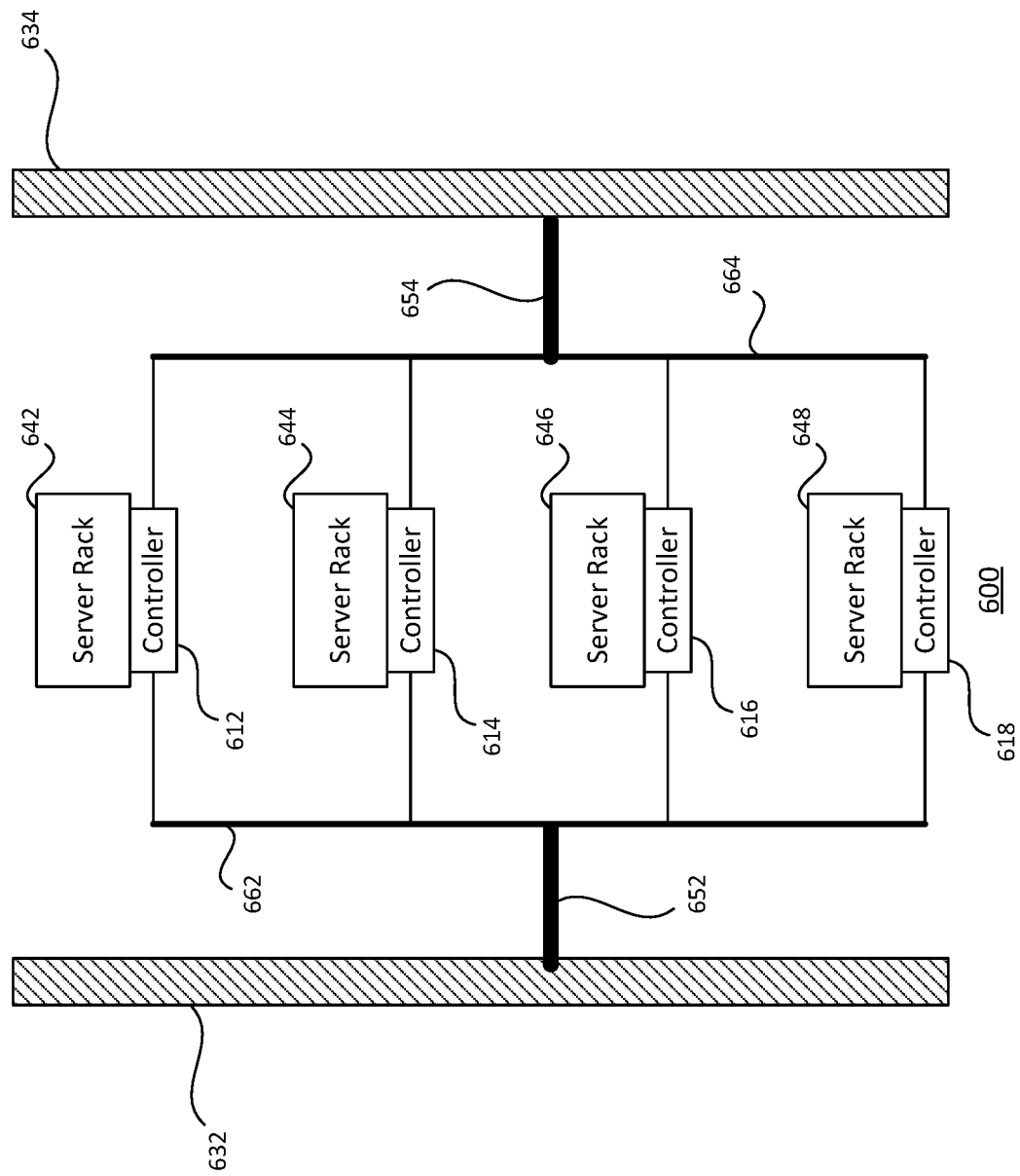
FIG. 6 is an example implementation of the example electrical connection of FIG. 6 according to aspects of the disclosure.

FIG. 6 illustrates an example implementation of a power distribution system 600 using multiple networks of superconductor cables connected to respective power sources, such as in the system 500 of FIG. 5. In the example of FIG. 6, each server rack 642, 644, 646, 648 is connected to a first power plane 632 through a first interface 652, a first DC bus duct 662, and tap connections as described in connection with FIG. 5. Respective controllers 612, 614, 616, 618 are positioned at corresponding server racks 642, 644, 646, 648. Each controller is configured to control opening and closing a connection between the DC bus ducts 662, 664 and the controller's corresponding server rack. Thus, each controller is configured to manage power distribution from the individual tap connections of each DC bus duct 662, 664 to the respective server racks, in turn controlling the distribution of power from both power planes 632, 634 to the individual server racks 642, 644, 646, 648. As with the example of FIG. 3, each server rack may be provided with a separate controller, or clusters of server racks may be provided with a single controller, thereby controlling power distribution on a cluster-by-cluster basis.

In other examples, controllers may be provided in addition to or in place of the controllers 612, 614, 616, 618 shown in FIG. 6. For example, a first controller may be positioned along the first DC bus duct 662 in order to control opening and closing the connections between the first DC bus duct 662 and the server racks, and a second controller may be positioned along the second DC bus duct 664 in order to control opening and closing the connections between the second DC bus duct 664 and the server racks. This arrangement is similar to the arrangement described in connection with FIG. 3, but adapted to control power from multiple power sources received over separate superconducting cable power plane networks.

In the examples of FIGS. 2-6, each DC bus duct is connected to a respective superconducting cable. However, in other examples, the DC bus ducts may include multiple superconducting cable connections in order to connect to multiple power planes, or more particularly to multiple power sources.

Figure 7:
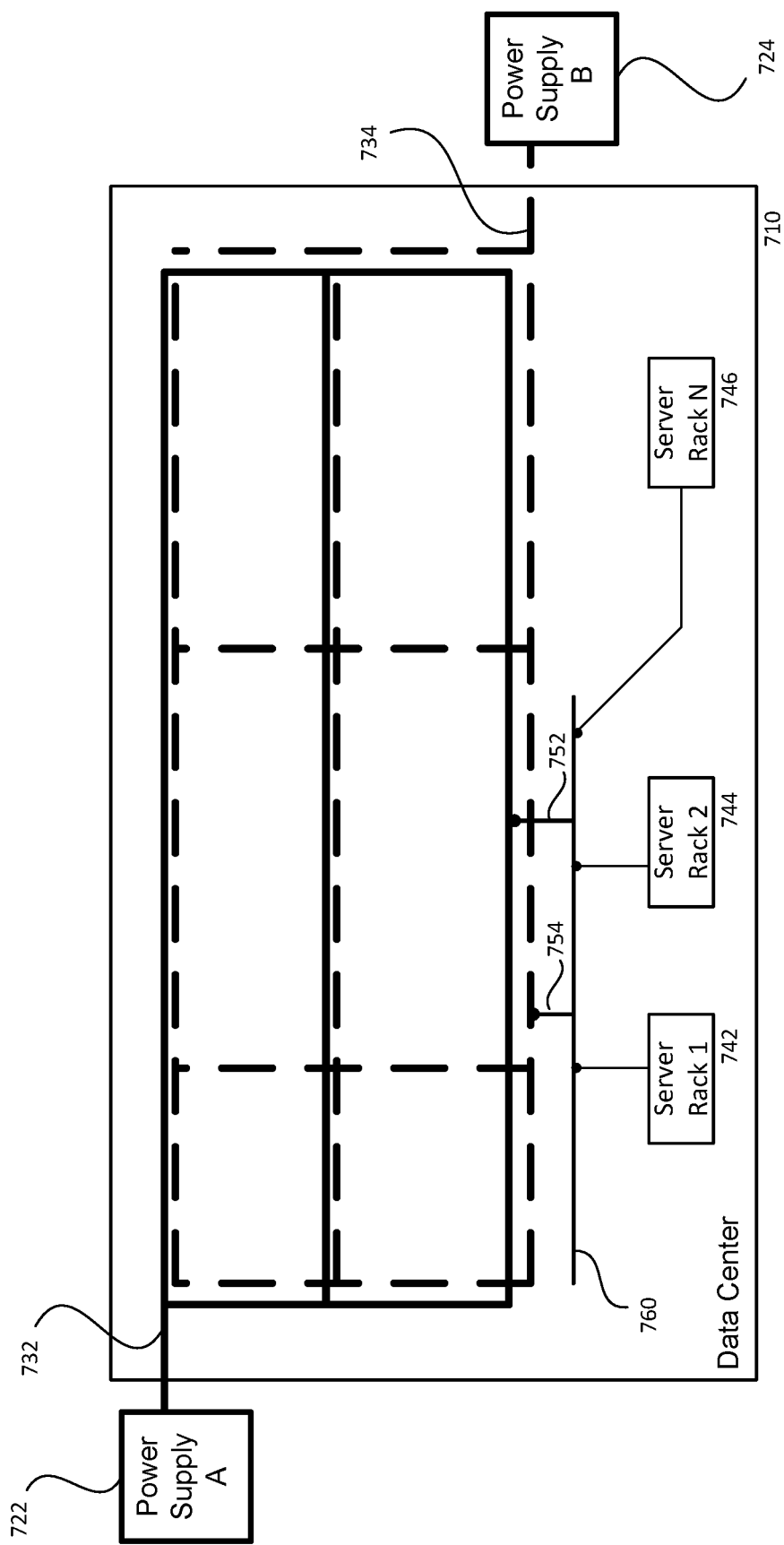
FIG. 7 is a schematic diagram of another example electrical connection between power planes and server infrastructure according to aspects of the disclosure.

FIG. 7 illustrates another example electrical connection between a superconducting cable power plane and server racks of a datacenter. In the system 700 of FIG. 7, a datacenter building 710 is connected to each of Power Supply A 722 and Power Supply B 724 from opposite sides of the building 710. Power Supply A 722 is connected to a first power plane network of superconducting cables 732 inside the building by way of a first power supply connection at the first side of the building 710. Power Supply B 724 is connected to a second power plane network of superconducting cables 734 inside the building by way of a second power supply connection at the opposing second side of the building 710. As with the example system of FIG. 6, the networks of superconducting cables 732, 734 are not connected to each other, but may be arranged to provide electrical power from either power source to any point within the building 710.

As with the example of FIG. 5, Server racks 742, 744, 746 may be electrically connected to both power supplies 722, 724 by way of a connection to respective superconducting cables from the parallel power plane networks 732, 734. However, in the example of FIG. 7, both the first power plane 732 and the second power plane 734 are connected to a single DC bus duct 760 in order to provide power to the server racks 742, 744, 746. Each power plane 632, 634 includes a respective interface 752, 754 for providing DC power to the single DC bus duct 760. Thus, each server rack may include a single DC bus duct connection in order to connect to separate power planes.

Figure 8:
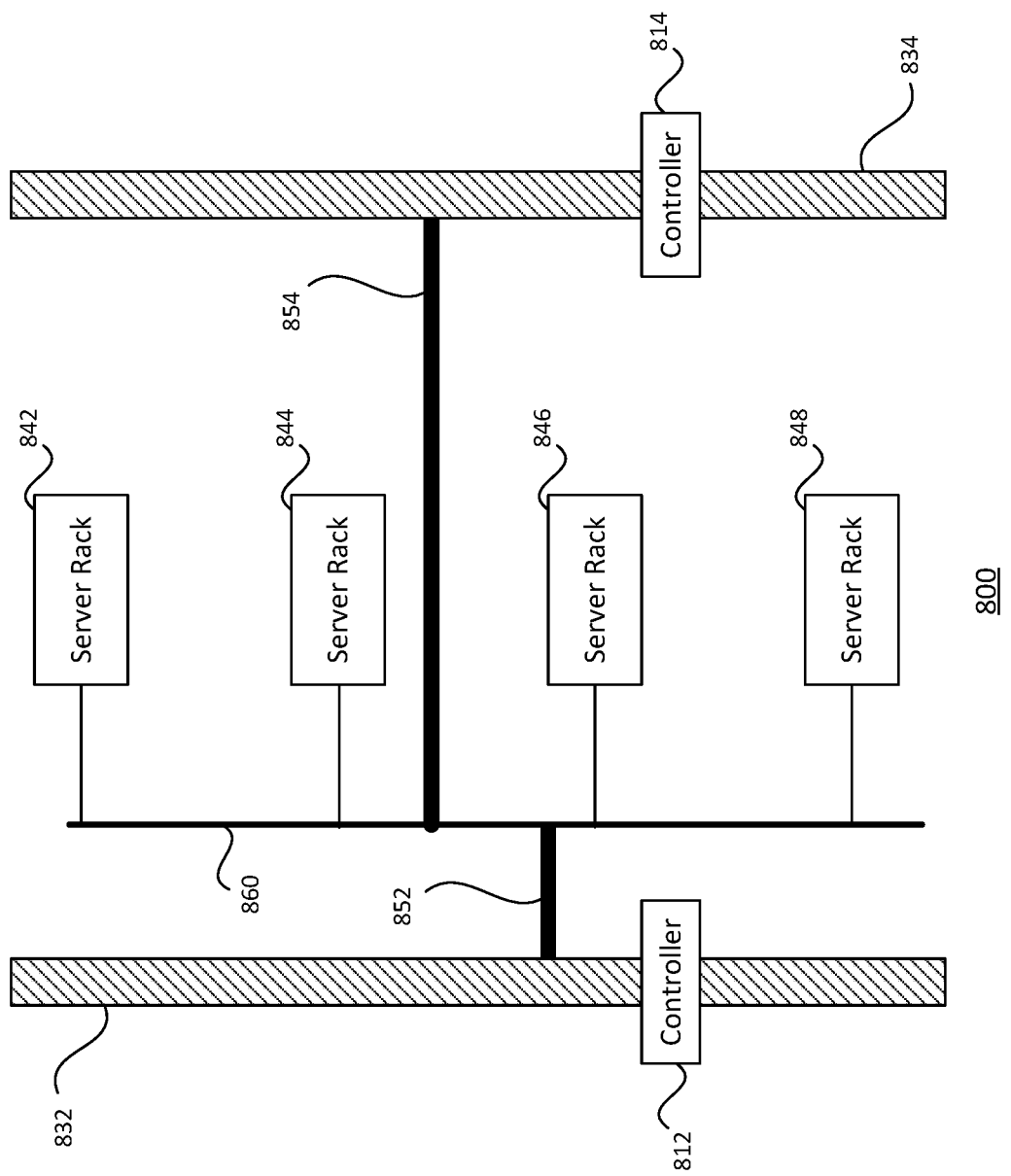
FIGS. 8 and 9 are example implementations of the example electrical connection of FIG. 8 according to aspects of the disclosure

FIG. 8 illustrates an example implementation of a power distribution system 800 using multiple networks of superconductor cables connected to respective power sources, such as in the system 700 of FIG. 7. In the example of FIG. 8, each server rack 842, 844, 846, 848 is connected to both a first power plane 832 and a second power plane 834 through a single DC bus duct 860. The single DC bus duct 860 includes respective interfaces 852, 854 for connecting to the first and second power planes 832, 834. Respective controllers 812, 814 are positioned at the superconducting cables of the respective power planes 832, 834 in order to control whether power is provided to the DC bus duct 860 from each respective power source.

Figure 9:
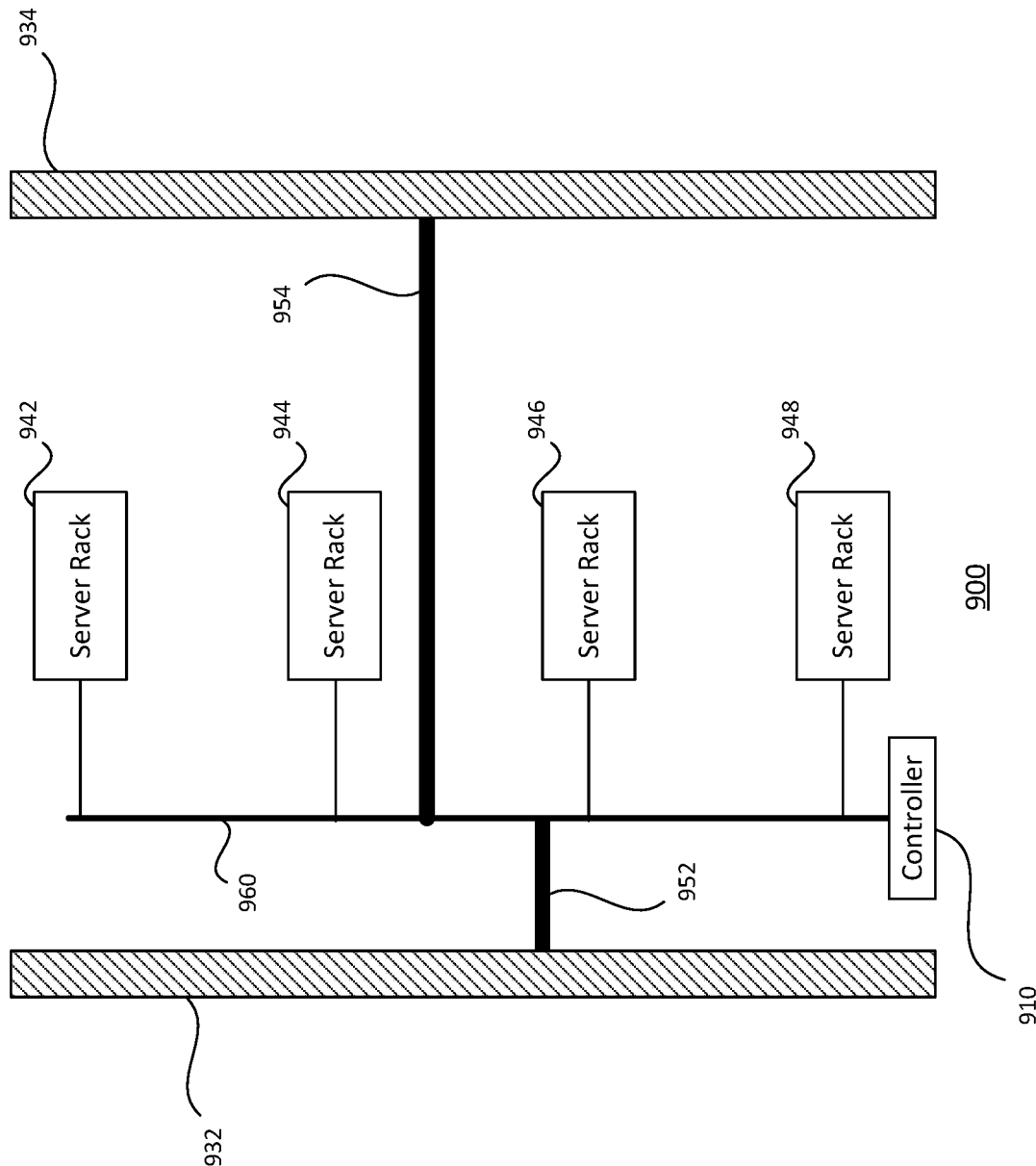

FIG. 9 illustrates another example implementation of a power distribution system 900 using multiple networks of superconductor cables connected to respective power sources, such as in the system 700 of FIG. 7. In the example of FIG. 9, each server rack 942, 944, 946, 948 is connected to both a first power plane 932 and a second power plane 934 through a single DC bus duct 960. The single DC bus duct 960 includes respective interfaces 952, 954 for connecting to the first and second power planes 932, 934. A single controller 910 is positioned at the single DC bus duct 960 in order to control opening and closing the connections between the DC bus duct 960 and the server racks 942, 944, 946, 948. Thus, the controller 910 is configured to provide control signals to each respective interface 952, 954 and to the individual tap connectors of the server racks over the DC bus duct 960, thereby controlling the distribution of power from each power plane 932, 934 to the individual server racks 942, 944, 946, 948. In the example of FIG. 9, each DC bus duct of the datacenter building may be provided with a separate controller in order to control the distribution of power from the power to the server racks connected to that DC bus duct.

In other examples, controllers may be provided in addition to or in place of the controllers shown in FIGS. 8 and 9. For example, each server rack, or each cluster of server racks, may include its own controller for controlling connection between the server rack and the DC bus duct, comparable to the controllers shown in example arrangements of FIGS. 4 and 6.

It should be understood that the example arrangements of FIGS. 3, 4, 6, 8 and 9 are provided merely as examples, and that the concepts from one example may be adopted in other example arrangements. For instance, the example arrangements of FIGS. 3, 4, 6 and 9 may be adapted to include controllers at the respective superconducting cables, as is shown in the example of FIG. 8.

The above examples involve power distribution elements having DC components, such as DC superconducting cables and DC bus ducts. However, it should be appreciated that the same concepts may be applied to alternating current (AC) components, such as AC superconducting cables and AC bus ducts. Thus, the example systems may be arranged so as to deliver power to the server racks using either AC or DC power.

Because the example systems are connected to power sources on multiple sides of a building, there is no one side of the building from which all current flows. As such, no particular side or component of the power bus can be characterized as "upstream" or "downstream" from another side or component. Certain components and sides may be "upstream" vis-à-vis a single power source, but "downstream" vis-à-vis a different power source. This provides several advantages over typical arrangements having upstream elements, downstream elements, and one-directional current flow. This may result in more uniform current density throughout the datacenter. Providing uniform current density, in turn, may avoid the underutilization of power distribution elements in the power plane, such as when bus ducts of a conventional power plane have a predefined capacity of electrical power but are underutilized downstream where current density is lowest. Also, if power is cut off from one power source due to failure of power distribution components at one side of the building, the server racks may still receive power from the power sources connected to the other side of the building through the power distribution elements on the other side of the building.

The systems described herein provide improved control over the provision of high power density to particular locations of the datacenter as needed. In conventional datacenters in which the provision of high current density to specific locations is not possible, it is often necessary to disperse individual server racks having high current density throughout the datacenter building space, instead of concentrating the high density server racks together in a discrete location, such as an aisle or quadrant of the building. For instance, high current density may be required for server racks including networking gear, or for server racks performing machine learning operations, such as in a machine learning data catalog. Dispersal of the high current density server racks may be necessary in order to balance power needs throughout the building, since power distribution is limited in its configurability. However, having to disperse high current density server racks requires advance planning, and makes it difficult to add more high current density or low current density server racks at a later time without disrupting the previous configuration. Advance planning and disrupting server rack configurations add cost and time to maintenance operations. Additionally, some high current density server racks may include confidential data that would be preferable to section off in a discrete corner or section of the building instead of dispersing throughout the building.

By contrast, the ability to provide high current density to specific locations without having to balance power density avoids the need to plan server rack configurations in advance. New high density servers may be clustered together in a single region or section of the building, and the superconducting cables of the power plane may supply sufficient power to that region or section at high current density without experiencing electrical losses along the conductor elements. This approach may in turn allow for server racks requiring high current density and high confidentiality, such as MLDC server racks, to be concentrated within a discrete portion of the building. Access may be granted to low-confidentiality servers, such as for maintenance operations, while access to the high confidentiality servers remains restricted.

In a similar vein, new low density servers may be clustered together in a single region, and the diverter switches of the power bus may be controlled to make a power supply configuration that provides low current density in a location of the new server racks.

The above concepts are equally applicable for initial arrangement of high current density and low current density server racks within the datacenter when first being set up, as well as subsequent addition of new server racks after the datacenter has already been set up.

Example Methods

Figure 10:
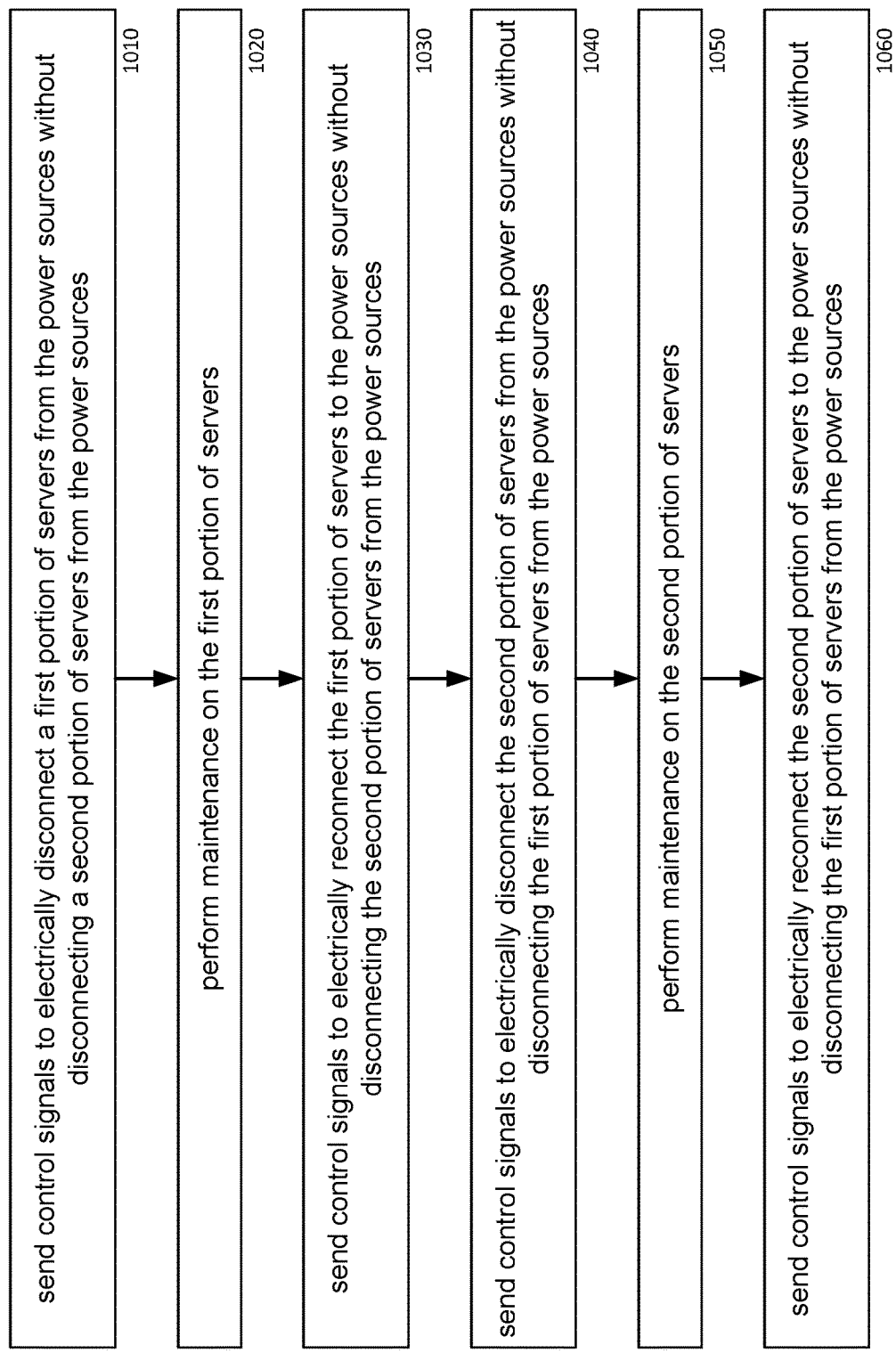
FIG. 10 is a flow diagram of an example server maintenance routine, according to aspects of the disclosure.

FIG. 10 is a flow diagram of an example maintenance routine 1000 in accordance with the present application. The routine may permit for separate sections of a datacenter to be serviced at separate times. A first section of the datacenter may include a first portion of server racks, and a second section of the datacenter may include a second portion of server racks. The sections may be physically separate from one another, such that one section may be disconnected from multiple power sources without affecting the connection between the multiple power sources and the other section. This may be advantageous for conducting maintenance on one portion of server racks without affecting operation of another portion of the server racks. It should be understood that the routine described herein is merely an example, and in other examples, certain steps may be added, subtracted, replaced or reordered.

At block 1010, first control signals may be provided from controllers controlling the first portion of servers to electrically disconnect the first portion of servers from the connected power sources. The control signals may be provided automatically or manually. Additionally, disconnection of the first portion of servers may be accomplished without disconnecting another, second portion of servers from the power sources. At block 1020, maintenance may be conducted on the disconnected first portion of servers. At block 1030, second control signals may be provided from controllers controlling the first portion of servers to electrically reconnect the first portion of servers to the power sources. As with the disconnection process of block 1010, reconnecting the first portion of servers at block 1030 may be accomplished without disconnecting the second portion of servers from the power sources. Upon completion of blocks 1010-1130 of routine 1000, maintenance for the first portion of servers is completed.

In some examples, the second portion of servers may be maintained in the same manner as the first portion. Blocks 1040-1160 describe maintenance of the second portion of servers. At block 1040, third control signals may be provided from controllers controlling the second portion of servers to electrically disconnect the second portion of servers from the connected power sources. Disconnection of the second portion of servers may be accomplished without disconnecting the first portion of servers. At block 1050, maintenance may be conducted on the disconnected second portion of servers. At block 1060, fourth control signals may be provided from controllers controlling the second portion of servers to electrically reconnect the second portion of servers to the power sources, again without disconnecting the first portion of servers from the power sources in the process.

At no time of the maintenance routine 1000 does disconnection of an "upstream" element cause disconnection of a "downstream" element. This is because the system of the present disclosure provides multi-directional current flow, and lacks elements that may be characterized as "upstream" and "downstream" in absolute terms.

Additionally, the maintenance routine 1000 allows for the separate maintenance of high-confidentiality and low-confidentiality servers based on their locations, since in the above described example systems, servers may be clustered based on such properties as confidentiality without concern for load balancing or advance layout planning. As noted above, conventional datacenters typically require high current density server racks to be dispersed within the physical space of the datacenter building in order to provide appropriate load balancing between power distribution elements of the building. By contrast, the example arrangements of the present disclosure permit for high current density server racks to be concentrated in a discrete physical location of the datacenter building. By extension, server racks having a high level of confidentiality, such as MLDCs or network gear, may be concentrated in a more secure section of the building, whereby access may be provided to lower-confidentiality server racks while maintaining restricted access to the higher-confidentiality server racks.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

Most of the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order, such as reversed, or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system comprising:
    a network of superconducting electrical cables configured to supply power to a plurality of server racks arranged within a space of a building, the network further comprising a plurality of switches;
    a first power source connection configured to connect a first power source to the network of superconducting electrical cables from a first side of the building and configured to supply power to a first section of the network of superconducting electrical cables;
    a second power source connection configured to connect a second power source to the network of superconducting electrical cables from a second side of the building different from the first side and configured to supply power to a second section of the network of superconducting electrical cables; and
    a plurality of bus ducts, each bus duct configured to connect the network of superconducting electrical cables to one or more of the plurality of server racks,
    wherein the plurality of switches included in the network of superconducting electrical cables are configured to control electrical connections between sections of the network of superconducting electrical cables and are configured to direct power between the first and second power sources and the sections of the network of superconducting electrical cables.

2. The system of claim 1, wherein the first side and the second side are opposite sides of the building.

3. The system of claim 1, further comprising a plurality of switch controllers, each switch controller configured to control an electrical connection between at least one of the first and second power source connection and at least one server rack.

4. The system of claim 3, wherein the plurality of switch controllers include an electrical switch positioned at a first bus duct and configured to control an electrical connection between the first bus duct and one or more server racks connected to the first bus duct.

5. The system of claim 3, wherein the plurality of switch controllers include an electrical switch positioned at a first server rack and configured to control an electrical connection between a plurality of bus ducts connected to the first server rack and the first server rack.

6. The system of claim 1, wherein the plurality of switches includes at least one superconducting switch positioned between a first section and a second section of the network of superconducting electrical cables and configured to control an electrical connection between the first section and the second section of the network of superconducting electrical cables.

7. The system of claim 1, wherein the network of superconducting electrical cables is positioned vertically above the plurality of server racks.

8. The system of claim 1, wherein the superconducting electrical cables are configured to transmit a direct current (DC) voltage between about 1 kV and 20 kV.

9. The system of claim 8, wherein the superconducting electrical cables are configured to transmit a DC current between about 10 kA and 20 kA.

10. A datacenter comprising:
    a system according to claim 1; and
    the plurality of server racks arranged within a space of a building.

11. A system comprising:
    a network of superconducting electrical cables configured to supply power to a plurality of server racks arranged within a space of a building;
    a first power source connection configured to connect a first power source to the network of superconducting electrical cables from a first side of the building and configured to supply power to a first section of the network of superconducting electrical cables;
    a second power source connection configured to connect a second power source to the network of superconducting electrical cables from a second side of the building different from the first side and configured to supply power to a second section of the network of superconducting electrical cables;
    a plurality of bus ducts, each bus duct configured to connect the network of superconducting electrical cables to one or more of the plurality of server racks; and
    a plurality of switch controllers, each switch controller configured to control an electrical connection between at least one of the first and second power source connection and at least one server rack,
    wherein the plurality of server racks are divided into discrete portions, wherein each discrete portion is connected to each of the first and second power sources, and wherein the plurality of switch controllers are configurable to disconnect any one of the discrete portions of the plurality of server racks from the first and second power sources while the other portions of the plurality of server racks remain connected to at least one of the first or second power source.

12. The system of claim 11, wherein the space of the building includes a first section containing a first discrete portion of servers assigned a relatively high priority, and a second section containing a second discrete portion of servers assigned a relatively low priority.

13. The system of claim 12, wherein the first portion of servers includes at least one of machine learning servers or networking gear.

14. A system comprising:
a network of superconducting electrical cables configured to supply power to a plurality of server racks arranged within a space of a building, wherein the network of superconducting electrical cables is arranged to permit power flow therethrough in at least one of a snake configuration, a ring configuration or a mesh configuration;
a first power source connection configured to connect a first power source to the network of superconducting electrical cables from a first side of the building and configured to supply power to a first section of the network of superconducting electrical cables;
a second power source connection configured to connect a second power source to the network of superconducting electrical cables from a second side of the building different from the first side and configured to supply power to a second section of the network of superconducting electrical cables; and
a plurality of bus ducts, each bus duct configured to connect the network of superconducting electrical cables to one or more of the plurality of server racks.

15. The system of claim 14, wherein the network of superconducting electrical cables is switchable between any two of the snake configuration, the ring configuration and the mesh configuration.

16. The system of claim 14, wherein the network of superconducting electrical cables is switchable between all three of the snake configuration, the ring configuration and the mesh configuration.

17. A server maintenance method for updating portions of servers within a datacenter that includes a network of superconducting electrical cables configured to supply power from each of a first power source and a second power source to a plurality of server racks arranged within a space of a building, wherein the network of superconducting electrical cables is connected to the first power source via a first power source connection positioned at a first side of the building and to the second power source via a second power source connection positioned at a second side of the building different from the first side, and one or more controllers configured to control electrical connections between the first and second power sources and the plurality of server racks, the method comprising:
providing, from the one or more controllers, first control signals to electrically disconnect
a first portion of servers from the first and second power sources without disconnecting a second portion of servers from the first and second power sources;
conducting maintenance on the first portion of servers;
providing, from the one or more controllers, second control signals to electrically reconnect the first portion of servers to the first and second power sources without disconnecting the second portion of servers from the first and second power sources;
providing, from the one or more controllers, third control signals to electrically disconnect the second portion of servers from the first and second power sources without disconnecting the first portion of servers from the first and second power sources;
conducting maintenance on the second portion of servers; and
providing, from the one or more controllers, fourth control signals to electrically reconnect the second portion of servers to the first and second power sources without disconnecting the first portion of servers from the first and second power sources,
wherein the first and second portions of servers are portioned according to respective
levels of confidentiality.

18. The server maintenance method of claim 17, wherein the first control signals electrically disconnect a first section of the network of superconducting electrical cables from a second section of the network of superconducting electrical cables, and the second control signals electrically reconnect the first section of the network of superconducting electrical cables to the second section of the network of superconducting electrical cables.

19. The server maintenance method of claim 17, wherein the first control signals electrically disconnect the first portion of servers from the network of superconducting electrical cables at one or more direct current bus ducts configured to provide power from the network of superconducting electrical cables to the first portion of servers, and wherein the second control signals electrically reconnect the first portion of servers to the network of superconducting electrical cables at the one or more direct current bus ducts.

20. The server maintenance method of claim 17, wherein the first control signals electrically disconnect a first server rack of the first portion of servers from each of a first direct current bus duct configured to provide power from the first power source to the first server rack and a second direct current bus duct configured to provide power from the second power source to the first server rack, and wherein the second control signals electrically reconnect a first server rack to the first and second direct current bus ducts.

* * * * *